United States Patent
Loering et al.

(10) Patent No.: US 9,201,226 B2
(45) Date of Patent: Dec. 1, 2015

(54) IMAGING OPTICS

(75) Inventors: Ulrich Loering, Schwaebisch Gmuend (DE); Ralf Mueller, Aalen (DE); Hans-Juergen Mann, Oberkochen (DE); Norman Baer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 854 days.

(21) Appl. No.: 13/438,591

(22) Filed: Apr. 3, 2012

(65) Prior Publication Data

US 2012/0208115 A1    Aug. 16, 2012

Related U.S. Application Data

(63) Continuation of application No. PCT/EP2010/066525, filed on Oct. 29, 2010.

(30) Foreign Application Priority Data

Nov. 13, 2009  (DE) .......................... 10 2009 046 685

(51) Int. Cl.
*G03B 27/54*   (2006.01)
*G02B 17/06*   (2006.01)
*G02B 5/00*    (2006.01)
*G02B 27/00*   (2006.01)
*G03F 7/20*    (2006.01)

(52) U.S. Cl.
CPC ............ *G02B 17/0657* (2013.01); *G02B 5/005* (2013.01); *G02B 27/0018* (2013.01); *G03F 7/70233* (2013.01); *G03F 7/70275* (2013.01)

(58) Field of Classification Search
CPC ............... G02B 5/005; G02B 17/0657; G02B 27/0018; G03F 7/70275; G03F 7/70233
USPC ...................................... 355/55, 67
See application file for complete search history.

(56) References Cited

U.S. PATENT DOCUMENTS

| 5,212,588 | A  | 5/1993 | Viswanathan et al. |
| 6,621,557 | B2 | 9/2003 | Takahashi |
| 6,750,948 | B2 | 6/2004 | Omura |
| 2003/0030917 | A1 | 2/2003 | Omura |

(Continued)

FOREIGN PATENT DOCUMENTS

| DE | 10 2008 042 917 A1 | 4/2009 |
| DE | 10 2007 051 671 A1 | 5/2009 |

(Continued)

OTHER PUBLICATIONS

The International Search Report for corresponding PCT Appl No. PCT/EP2010/066525, dated Apr. 13, 2011.

(Continued)

*Primary Examiner* — Peter B Kim
(74) *Attorney, Agent, or Firm* — Fish & Richardson P.C.

(57) ABSTRACT

An imaging optics includes a plurality of mirrors which reflect imaging light to image an object field in an object plane into an image field in an image plane. A mirror body of at least one of the mirrors has a through-opening for the imaging light to pass through. The through-opening has an internal region of a smallest opening width in the mirror body. The through-opening expands from the internal region towards both edge regions of the mirror body. A disturbing influence of unused light portions is reduced or eliminated completely.

20 Claims, 9 Drawing Sheets

(56) References Cited

U.S. PATENT DOCUMENTS

2010/0231885 A1  9/2010  Mann
2010/0265481 A1  10/2010  Mann et al.

FOREIGN PATENT DOCUMENTS

JP        2005-086148        3/2005
WO        WO 2009/053023     4/2009

OTHER PUBLICATIONS

German Examination Report, with English translation, for corresponding DE Appl No. 10 2009 046 685.1, dated Jan. 28, 2010.
M. Lampton et al., "Comparison of on-axis three-mirror-anastigmat telescopes", Proc. of SPIE vol. 6687, 66870S1 (2007).
Hans-Jürgen Mann et al., "Reflective high-NA projection lenses", Proc. of SPIE vol. 5962, 596214, (2005).

IMAGING OPTICS

CROSS-REFERENCE TO RELATED APPLICATIONS

This application is a continuation of, and claims benefit under 35 USC 120 to, international application PCT/EP2010/066525, filed Oct. 29, 2010, which claims benefit under 35 USC 119 of German Application No. 10 2009 046 685.1, filed Nov. 13, 2009. International application PCT/EP2010/0066525 and German Application 10 2009 046 685.1 are hereby incorporated by reference in their entirety.

FIELD

The disclosure relates to an imaging optics for imaging an object field into an image field. The disclosure further relates to an illumination system including such an imaging optics, a projection exposure apparatus including such an illumination system, a method for the fabrication of a microstructured or nanostructured component using such a projection exposure apparatus, and a structured component fabricated by such a method.

BACKGROUND

Imaging optical systems according to the type named at the outset are disclosed, for example, in U.S. Pat. No. 6,750,948 B.

SUMMARY

The disclosure seeks to develop an imaging optics so that a disturbing influence of unused light portions, which are hereinafter referred to as scattered light, is reduced or eliminated completely.

In one aspect, the disclosure provides an imaging optics which includes a plurality of mirrors which reflect imaging light and thus image an object field in an object plane into an image field in an image plane. The beam path of the imaging light includes a pupil obscuration. A mirror body of at least one of the mirrors includes a through-opening which is surrounded by a reflection surface. The mirror with the through-opening is arranged in the region of a pupil plane of the imaging optics.

It has been found according to the disclosure that an unused portion of a reflection surface of a mirror close to the pupil in a pupil-obscured imaging optics may be provided with an opening which may be used to dispose of undesirable portions of scattered light. The through-opening may at the same time be an obscuration stop of the imaging optics. The beam path of the imaging light has a pupil obscuration. In the region of a pupil plane of the imaging optics, a central region of the beam path is thus not used for imaging. The through-opening of the mirror is arranged in the region of a pupil plane of the imaging optics if an edge boundary of the through-opening is situated in the pupil plane or is adjacent to the pupil plane.

An intermediate space as disclosed herein can prevent an unwanted loss of imaging light via the through-opening. The intermediate space between the edge of the through-opening and the inner edge of the imaging light bundle reflected in the vicinity of the through-opening may be smaller than 3 mm, such as smaller than 1 mm.

Adapting the boundary wall of the through-opening to the beam path as disclosed herein can prevent unwanted reflections of scattered light at the boundary wall. A wall angle of the boundary wall may be adapted to a critical angle of incidence of the imaging light reflected in the vicinity of the through opening.

A light trap as disclosed herein can allowed controlled elimination of the scattered light.

A light trap as disclosed herein can make an additional guidance of the scattered light unnecessary. Alternatively, the light trap for the scattered light may be reflective, thus preventing the temperature of the light trap from increasing to disturbingly high values.

A cooling of the light trap as disclosed herein can allow for the use of an at least partially absorbing light trap even if the light trap is heavily exposed to scattered light.

An auxiliary device as disclosed herein can allow for an additional use of the through-opening in particular in those portions where no or only small amounts of scattered light can be expected. The auxiliary device may be a coupling mirror, a heating device, a cooling device, a deformation device such as an actuator, or a sensor.

In another aspect, the disclosure provides an imaging optics including a plurality of mirrors which reflect imaging light and thus image an object field in an object plane into an image field in an image plane. A mirror body of at least one of the mirrors includes a through-opening for the imaging light to pass through. The through-opening in the mirror body includes an internal region of a smallest opening width, with the through-opening expanding from the internal region towards both edge regions of the mirror body.

It has been found according to the disclosure that a through-opening having an internal region of smallest opening width expanding towards the edge regions of the mirror body may bring about an effective suppression of scattered light in the manner of a spatial filter. A through-opening of this type has a major effect if it is provided in the region of an intermediate image plane of the imaging optics. The two edge regions of the mirror body towards which the through-opening expands from the internal region with the smallest opening width may be provided in a reflection surface of the mirror and in a rear side of the mirror body.

The production of the through-opening in the shape of a double cone may involve a reasonable amount of effort.

Adapting the cone angles as disclosed herein can prevent unwanted reflections of scattered light at the walls of the through-opening or reduces the probability of such a reflection. A shape, in other words a contour, of a cone opening of the through-opening may also be adapted to a cross-sectional shape of an imaging light bundle.

An auxiliary device for the imaging optics can be configured so that the auxiliary device does not interfere with the beam path of the imaging light but is still arranged closely to the beam path for influencing the beam path or for measuring purposes.

In a further aspect, the disclosure provides an imaging optics including a plurality of mirrors which reflect imaging light and thus image an object field in an object plane into an image field in an image plane. The beam path of the imaging light includes a pupil obscuration. The mirror body of at least one of the mirrors includes an opening which is surrounded by a reflection surface of the mirror. The opening includes a through-opening portion which allows the imaging light to pass through. The opening also includes an assembly opening portion, and an auxiliary device is arranged in the assembly opening portion.

It has been found according to the disclosure that in a pupil-obscured system, a central region of a mirror close to the pupil is usually not used for reflection, the central region being substantially larger than a through-opening portion for imaging light to pass through. The remaining portion of a central region of a pupil-obscured mirror in a pupil-obscured system, which mirror is close to the pupil and is not used for reflection, may then be used as an assembly opening portion. The auxiliary device in the assembly opening portion may be a coupling mirror, a heating device, a cooling device, a deformation device, in particular an actuator, or a sensor. Instead of the opening of the mirror body surrounded by the reflection surface of the mirror, there may be provided a reflection region of the mirror body, the region in particular not being used for imaging purposes. The used reflection surface of the mirror need not necessarily surround an opening entirely provided in this region. Beyond the through-opening portion, the region not used for reflection need not be designed as an opening portion. Instead of the assembly opening portion, there may thus be provided an assembly region of the mirror body next to the through-opening portion.

The disclosure provides an illumination system including imaging optics as disclosed herein and an illumination optics for illumination of the object field with illumination light. The disclosure also provides a projection exposure apparatus include such an illumination system and a light source for generation of the illumination light. The disclosure further provides a method for the production of a structured component, which includes: providing a reticle and a wafer; projecting a structure on the reticle onto a light-sensitive layer of the wafer via such a projection exposure apparatus; and creating a microstructure or a nanostructure on the wafer. In addition, the disclosure provides a structured component, fabricated by such a method.

BRIEF DESCRIPTION OF THE DRAWINGS

Embodiments of the disclosure will hereinafter be explained in more detail in conjunction with the drawings in which.

DETAILED DESCRIPTION

A projection exposure apparatus 1 for microlithography has a light source 2 for illumination light or imaging light 3. The light source 2 is an EUV light source which generates light in a wavelength range of for example between 5 nm and 30 nm, in particular between 5 nm and 15 nm. The light source 2 may in particular be a light source with a wavelength of 13.5 nm or 6.9 nm. The light source 2 may be an LPP (laser produced plasma) light source or a GDP (gas discharge produced plasma) light source. Other EUV light sources are conceivable as well. Generally, even random wavelengths, for instance visible wavelengths or other wavelengths which are applicable in microlithography and for which suitable laser light sources and/or LED light sources are available (for instance 365 nm, 248 nm, 193 nm, 157 nm, 129 nm, 109 nm) are conceivable for the illumination light 3 guided in the projection exposure apparatus 1. A beam path of the illumination light 3 is very schematically outlined in FIG. 1.

Figure 1:
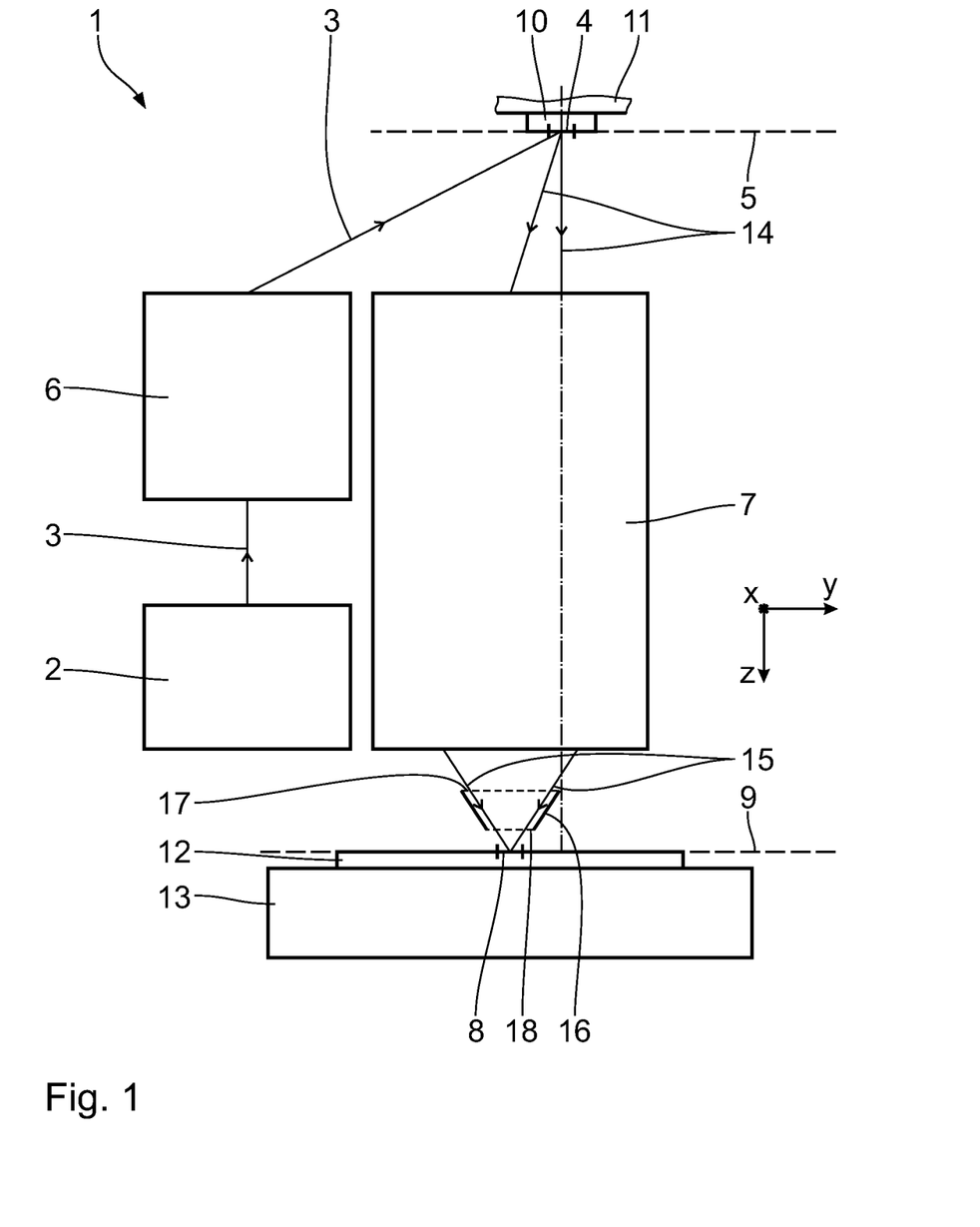
FIG. 1 shows a schematic view of a projection exposure apparatus for EUV microlithography.

An illumination optics 6 serves to guide the illumination light 3 from the light source 2 to an object field 4 in an object plane 5. A projection optics, in other words imaging optics 7, is used to image the object field 4 into an image field 8 in an image plane 9 in relation to a defined reduction scale. The projection optics 7 may be equipped with one of the embodiments shown in FIG. 2 et seqq. The projection optics 7 according to FIG. 2 reduces the image size by a factor of 8. Other reduction scales are conceivable as well such as 4×, 5× or even reduction scales which are greater than 8×. An image scale of 8× is in particular suitable for illumination light 3 with EUV wavelength as it allows an angle of incidence on a reflection mask 10 on the object side to be kept small. Moreover, with an imaging scale of 8×, the use of unusually large masks is not required. The image plane 9 in the projection optics 7 is arranged parallel to the object plane 5 in the embodiments according to FIG. 2 et seqq. In this process, a portion of the reflection mask 10, also referred to as reticle, is imaged that coincides with the object field 4. The reflection mask 10 is held in place by a mask holder 11.

The projection optics 7 generates images on the surface of a substrate 12 in the shape of a wafer which is held in place by a substrate holder 13. FIG. 1 shows a schematic view of a radiation bundle 14 of the illumination light 3 entering the projection optics 7 between the reticle 10 and the projection optics 7 as well as a radiation bundle 15 of the illumination light 3 exiting the projection optics 7 between the projection optics 7 and the substrate 12. In the embodiment according to FIG. 2, a numerical aperture of the projection optics 7 on the side of the image field may amount to 0.4 or even more. FIG. 1 is not to scale in this regard.

Adjacent to the radiation bundle 15 hitting the substrate 12 is a bundle envelope funnel 16. With respect to the cone angle thereof, the conical outer wall of the envelope funnel 16 is adapted to the numerical aperture of the radiation bundle 15. An extrapolation of the envelope funnel 16 (not shown) extends beyond a smaller outlet opening 18 of the envelope funnel 16 and also extends slightly beyond the substrate 12. Corresponding to its funnel shape, the envelope funnel 16 has a larger inlet opening 17 and the smaller outlet opening 18 for the radiation bundle 15. The envelope funnel 16 prevents or reduces the risk of gas released by a resist on the substrate 12 from entering the inside the projection optics 7 to a minimum; a contamination of the optical surfaces of the projection optics 7 is thus securely prevented.

In order to facilitate the description of the projection exposure apparatus 1 and the various embodiments of the projection optics 7, the drawing includes a Cartesian xyz coordinate system which illustrates how the components shown in the Figures are arranged with respect to each other. The x-direction extends perpendicularly into the drawing plane in FIG. 1. The y-direction extends to the right, and the z-direction extends downward.

The projection exposure apparatus 1 is a scanner-type apparatus. Both the reticle 10 and the substrate 12 are scanned in the y-direction when the projection exposure apparatus 1 is in use. It is conceivable as well to use a stepper-type projection exposure apparatus 1 where the reticle 10 and the substrate 12 are moved in steps along the y-direction between individual exposures.

Figure 2:
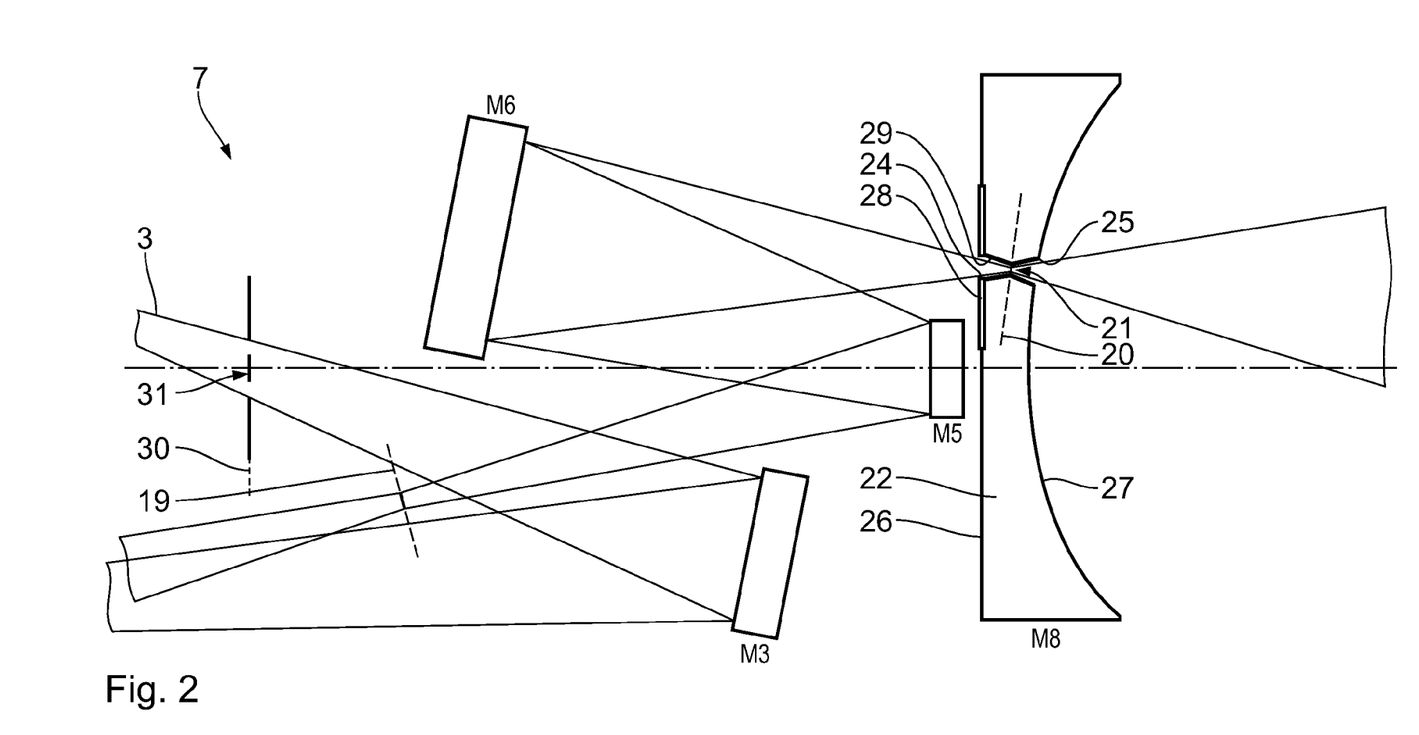
FIG. 2 shows a meridional section of a portion of a projection optics of the projection exposure apparatus according to FIG. 1 including a mirror which is provided with a through-opening for imaging light to pass through, the through-opening being designed for reducing scattered light.

FIG. 2 is a schematic view of a portion of an optical design of an embodiment of the projection optics 7. The projection optics 7 is a pure mirror optics, in other words a catoptric optical system. The Figure shows how the imaging light 3 is guided from a first mirror group via
mirrors M1 and M2 not shown in FIG. 2. Starting from the object field 4, the mirrors shown in the Figure are numbered in the order in which they reflect the illumination light 3. FIG. 2 shows the mirrors M3, M5, M6 and M8.

A first intermediate image plane 19 is arranged in the beam path between mirror M4, which is not shown, and mirror M5. Another intermediate image plane 20 is disposed in the beam path of the imaging light 3 between mirror M6 and mirror M7 which is not shown in FIG. 2.

Figure 4:
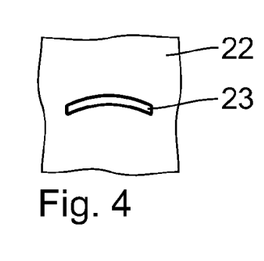
FIG. 4 shows a contour of the through-opening in the internal region of the mirror.

In the region of this second intermediate image plane 20, the imaging light 3 is guided into the mirror M8 through a through-opening 21 in a mirror body 22. The through-opening 21 in the mirror body 22 has an internal region 23 of a smallest diameter disposed on the same level as the second intermediate image plane 20. FIG. 4 shows a contour of this internal region 23 of the through-opening 21 in a plane which is perpendicular to the beam direction of the imaging light 3. This contour is matched exactly to a bundle shape of the bundle of imaging light 3 in the region of the intermediate image plane 20. The contour of the internal region 23 has an arcuate shape corresponding to the shapes of the object field 4 and the image field 8. Between the inner edge of the contour of the internal region 23 and an outer boundary of the bundle of imaging light 3 passing through the internal region 23, there is an intermediate space of approximately 1 mm. The intermediate space may also be larger, amounting to for instance 3 mm or 5 mm or even more.

Figure 3:
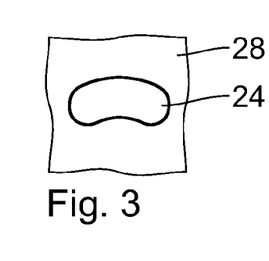
FIG. 3 shows a contour of the through-opening, seen from a rear side of the mirror.
Figure 5:
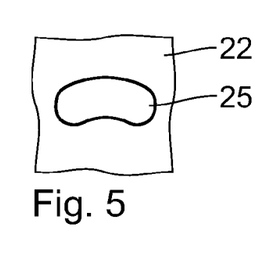
FIG. 5 shows a contour of the through-opening, seen from a reflection surface of the mirror.

The internal region 23 is a region of a smallest opening width of the through-opening 21. The through-opening 21 expands in each case continuously from the internal region 23 in the direction of two edge regions 24, 25 of the mirror body 22. FIG. 3 shows a contour of the edge region 24, in other words a contour of an inlet of the through-opening 21 starting from a rear side 26 of the mirror body 21. FIG. 5 shows a contour of the edge region 25, in other words a contour of an outlet of the through-opening 21 into a reflection surface 27 of the mirror M8.

The through-opening 21 is a double cone. The through-opening 21 expands conically from the internal region 23 towards each of the two edge regions 24, 25. Cone angles of the two conical expansions of the through-opening 21 are adapted to outer-bundle beam angles of the imaging light 3 near the through-opening 21, in other words to the numerical aperture of the imaging light 3 near the second intermediate image plane 20. Between the bundle of imaging light 3 and an internal wall of the through-opening 21, there is thus always a constant intermediate space.

In the vicinity of the edge region 24, the rear side 26 of the mirror body 22 is equipped with an additional stop 28. An internal contour of a stop opening 29 corresponds exactly to the contour of the edge region 24 of the through-opening 21. The additional stop 28 may be a mechanical body, in particular a sheet plate, an anti-reflection layer on the rear side 26 or a roughened portion on the rear side 26 of the mirror body 22.

In a pupil plane 30 of the projection optics 7, before the imaging light 3 is reflected by mirror M3, the projection optics 7 is provided with an obscuration stop 31 which on the one hand defines a boundary shape of the bundle of illumination light 3 in the pupil plane or stop plane 30, and on the other hand defines a central shading of the imaging light 3 in the pupil plane 30, in other words a pupil obscuration.

Figure 6:
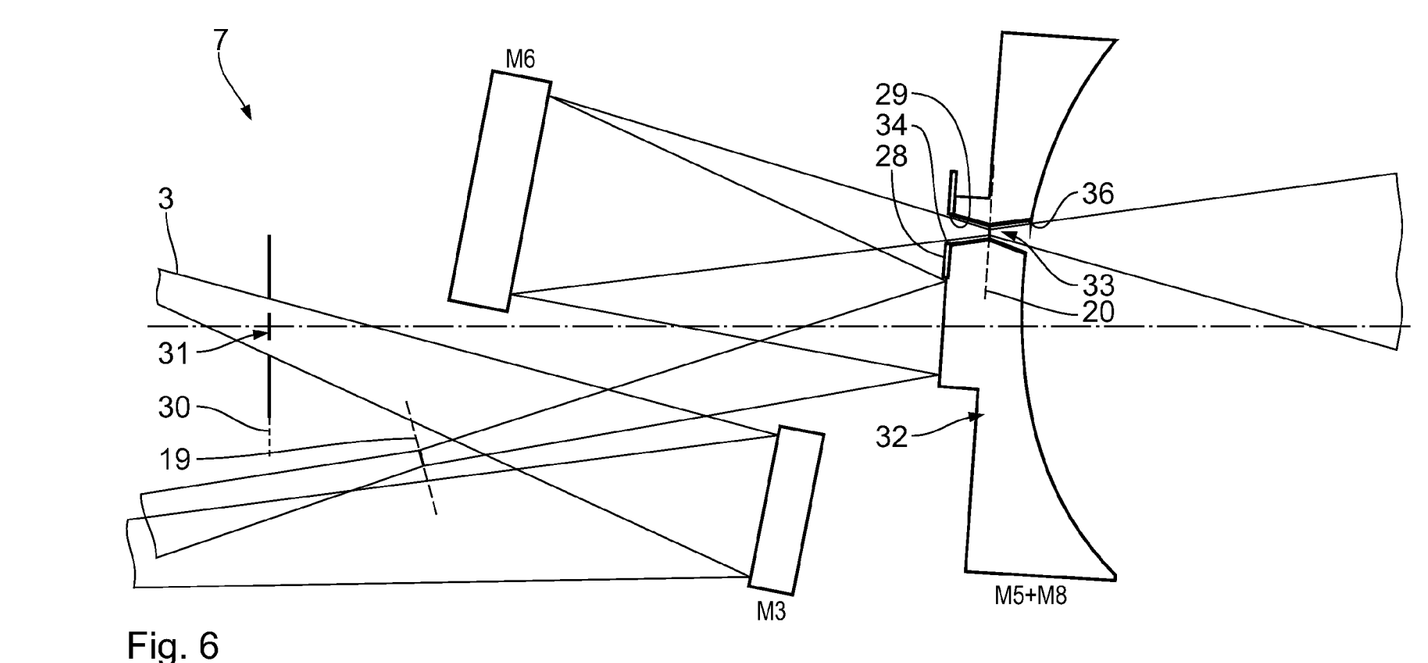
FIG. 6 shows a view similar to FIG. 2 of a portion of a projection optics with a monolithic mirror body including two mirrors of the projection optics, the mirror body having a through-opening for imaging light to pass through which is designed for reducing scattered light.

FIG. 6 shows another embodiment of the projection optics 7. Components which correspond to those that have already been explained above with reference to FIGS. 1 to 5 have the same reference numerals and are not discussed in detail again.

In the embodiment of the projection optics 7 according to FIG. 6, the two mirrors M5 and M8 are not separate as in the projection optics 7 according to FIG. 2 but are designed as a monolithic mirror body 32. In the embodiment according to FIG. 6, a through-opening 33 is provided in the monolithic mirror body 32, the function of through-opening 33 corresponding to that of through-opening 21 according to FIG. 2.

Figure 7:
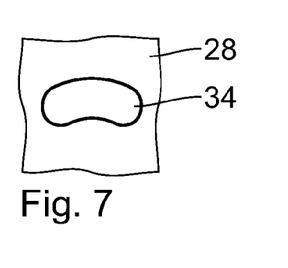
FIG. 7 shows a contour of the through-opening in the monolithic mirror body according to FIG. 6, seen from a side of the mirror body.

FIG. 7 shows a contour of an edge region 34 of the through-opening 33 which corresponds to the contour of the through-opening 24 of the embodiment according to FIG. 2.

Figure 8:
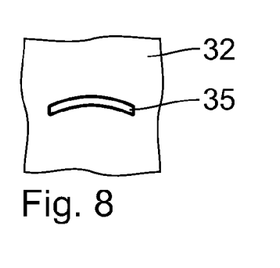
FIG. 8 shows a contour of the through-opening in the internal region of the monolithic mirror body according to FIG. 6.

FIG. 8 shows the contour of an internal region 35 at the location of the second intermediate image plane 20 which corresponds to the contour of the internal region 23 of the embodiment according to FIG. 2.

Figure 9:
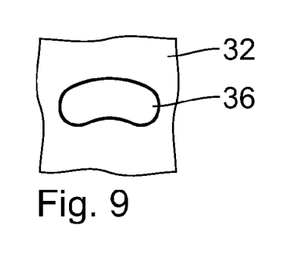
FIG. 9 shows a contour of the through-opening in the monolithic mirror body, seen from a side which is opposite to the side shown in FIG. 7.

FIG. 9 shows a contour of an edge region 36 of the through-opening 33 which corresponds to the edge region 25 of the embodiment according to FIG. 2.

In the embodiment of the projection optics 7 according to FIG. 6, the intermediate image plane 20 is shifted slightly to the left as compared to the embodiment according to FIG. 2; it is therefore arranged at half the thickness of the monolithic mirror body 32. As the monolithic mirror body 32 has a greater thickness than the mirror M8 of the embodiment according to FIG. 2, the through-opening 33 has a longer channel path for the illumination light 3 than the through-opening 21, thus resulting in an even more improved scattered light reduction.

Figure 10:
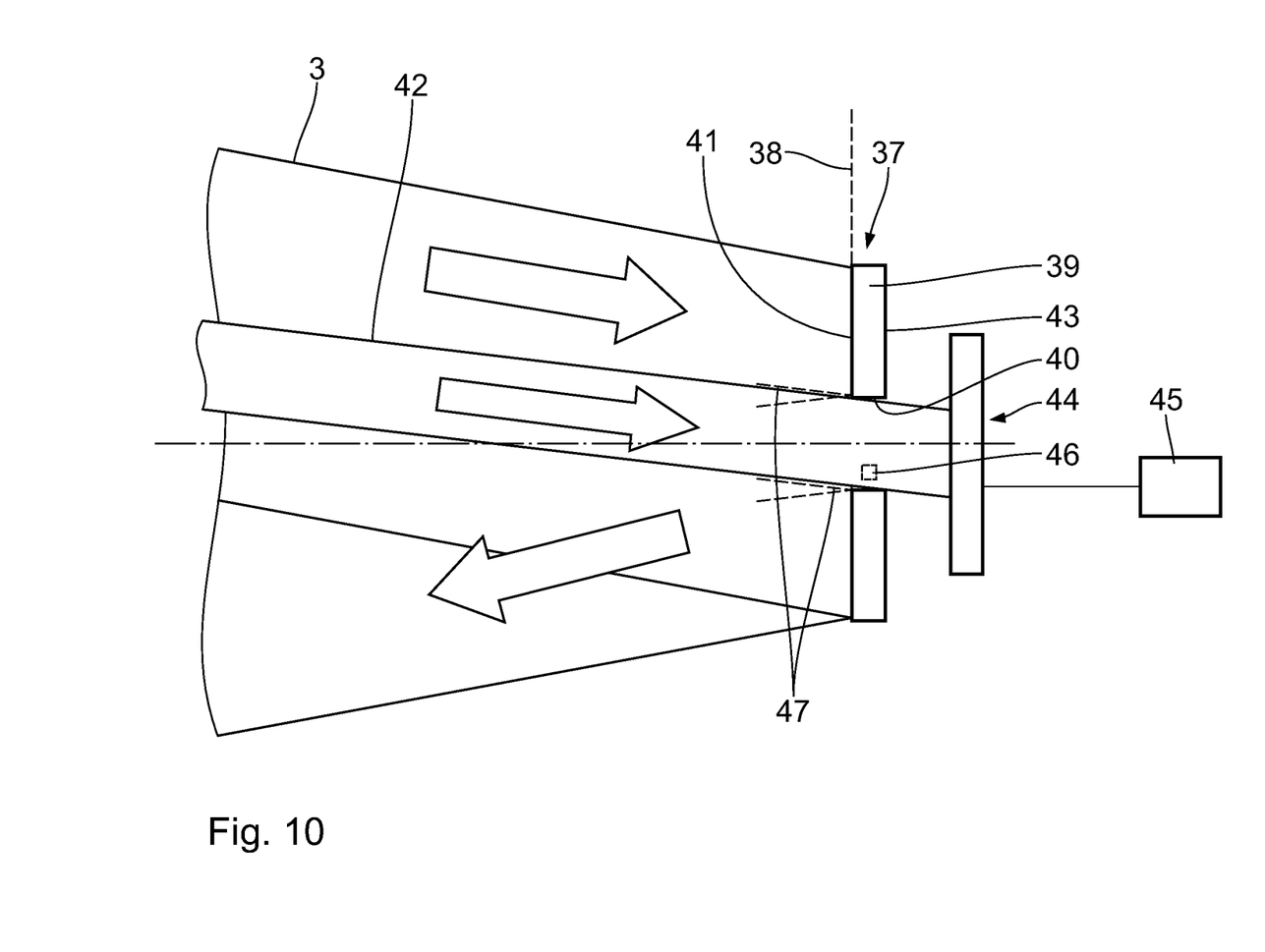
FIG. 10 shows a meridional section of a portion of another embodiment of a projection optics for the projection exposure apparatus according to FIG. 1 in the region of a mirror having a through-opening for scattered light, the mirror being arranged in the region of a pupil plane of the projection optics.

FIG. 10 shows another embodiment of the projection optics 7 for the projection exposure apparatus 1. FIG. 10 shows the region of a reflection of the imaging light 3 at a mirror 37. The mirror 37 is arranged in the region of a pupil plane, labeled with reference number 38 in FIG. 10, of the projection optics 7. A reflection surface of the mirror 37 is therefore disposed in the pupil plane 38 or is adjacent thereto. A mirror body 39 of the mirror 37 has a through-opening 40 which surrounds a reflection surface 41 of the mirror 37. As the mirror 37 is arranged in the region of the pupil plane 38, the through-opening 40 is arranged in the region of the pupil plane 38 as well. An edge boundary of the through-opening 40 is therefore either disposed in the pupil plane 38 or is adjacent thereto. The through-opening 40 may at the same time be an obscuration stop of the projection optics 7. A non-reflected portion 42 of light carried along by the bundle of illumination light 3 passes through the through-opening 40. A light trap 44 in the shape of an absorber body is arranged at a distance from a rear side 43 of the mirror 37. Having passed through the through-opening 40, the non-reflected portion 42 hits the light trap 44 by which it is absorbed. The light trap 44 is thermally coupled to a cooling device 45, allowing the temperature of the light trap 44 to be kept below a defined maximum temperature. The arrangement according to FIG. 10 also serves for scattered light reduction in the projection optics 7.

As an alternative to an absorbing light trap 44, the light trap 44 may also be designed as a reflective light trap.

In an alternative embodiment of a mirror in the manner of the mirror 37 according to FIG. 10, an auxiliary device 46 may be arranged in the through-opening 40 or in a region in front of the through-opening 40, as shown by dashed lines in the through-opening 40 according to FIG. 10. The auxiliary device 46 may be a coupling mirror for illumination light or for adjustment light, a heating or cooling device for the mirror 37, a deformation device such as an actuator, for forming the reflection surface 41 of the mirror 37 in a desired manner, or a intensity or energy sensor for determining a state of the light source 2.

Between an inner edge of the through-opening 40 and an inner edge 47 of a bundle of illumination light 3 annularly hitting the reflection surface 41 of the mirror 37, there may remain an intermediate space which is in the range of 1 mm. This prevents the illumination light 3 from being undesirably reflected by the reflection surface 41, and causes the illumination light 3 to pass through the through-opening 40.

The shape of an internal wall of the through-opening 40 may be adapted to a beam path or beam flow pattern of the illumination light 3. In particular a wall angle of the internal wall of the through-opening 40 may be adapted to a critical angle of incidence of the illumination light 3 reflected in the vicinity of the through-opening 3. Provided that the non-reflected portion 42 passing through the through-opening 40 has an angle of incidence which is comparable to the critical angle of incidence, an internal wall design of the through-opening 40 adapted in this manner prevents the portion 42 from undesirably hitting the internal wall of the through-opening 40.

Figure 11:
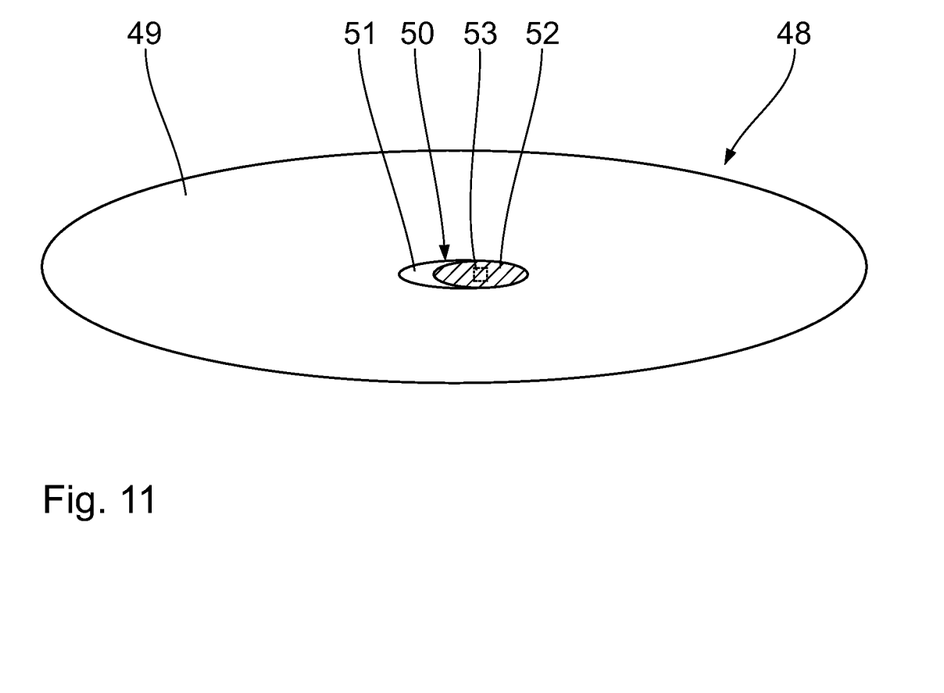
FIG. 11 shows a plan view of a mirror of another embodiment of a projection optics for the projection exposure apparatus according to FIG. 1, wherein the projection optics is a pupil-obscured optics and the mirror shown in the Figure is arranged close to the pupil and has a through-opening with a through-opening portion for imaging light to pass through and an assembly opening portion.

FIG. 11 shows a plan view of another embodiment of a mirror which may be used in the projection optics 7. The mirror depicted in FIG. 11 is labeled with reference number 48. If the mirror 48 is used, the projection optics 7 (having a pupil plane with reference number 38) has a pupil obscuration as already explained with respect to the embodiments described above. The mirror 48 has an optically used area 49 of its reflection surface which is arranged around an opening 50 in the shape of a ring. As shown in FIG. 11, the opening 50 may be elliptical or round. The opening 50 has a through-opening portion 51 which, similarly to the through-openings 21 and 33, is used for imaging light 3 to pass through. The opening 50 further has an assembly opening portion 52 in an optically unused area of the opening 50, in other words in an area of the opening 50 which is not used for imaging light 3 to pass through. As shown by dashed lines in FIG. 11, an auxiliary device 53 may be arranged in the assembly opening portion 52. The auxiliary device 53 may be an embodiment of an auxiliary device as already explained with respect to FIG. 10 and auxiliary device 46. The auxiliary device 53 may in particular be a sensor, a deflection mirror or an actuator for deforming the reflection surface of the mirror 48. Instead of the assembly opening portion 52, the substrate of the mirror 48 may in this area also be provided with a physical assembly portion of the mirror 48 to which the auxiliary device 53 is attached and which is not used for imaging purposes.

Figure 12:
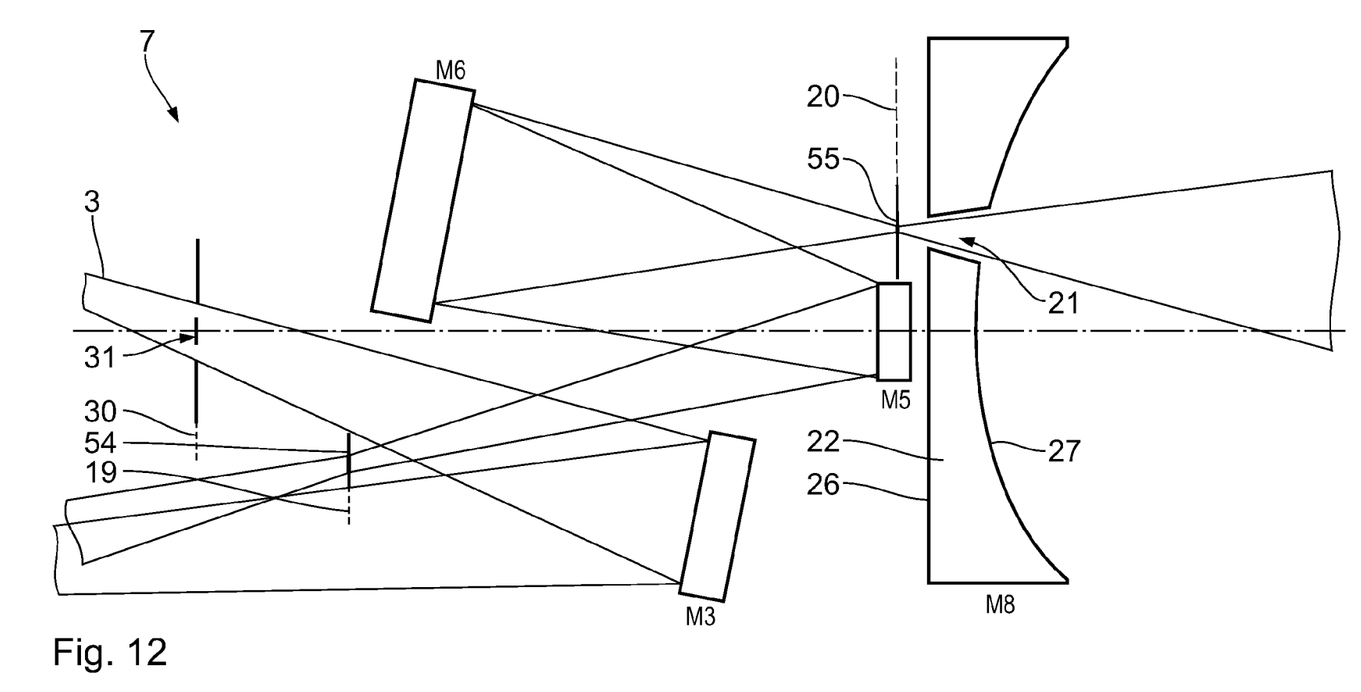
FIG. 12 shows a view similar to FIG. 2 of a portion of another embodiment of a projection optics for the projection exposure apparatus according to FIG. 1, the embodiment including two scattered light stops arranged in intermediate image planes of the projection optics.

FIG. 12 shows another embodiment of a projection optics 7 which may be used in the projection exposure apparatus 1. Components which correspond to those as already explained above with reference to FIGS. 1 to 11 have the same reference numerals and are not discussed in detail again.

Figure 13:
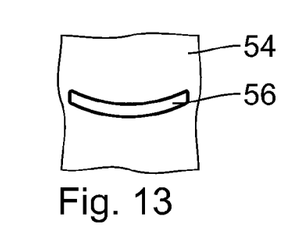
FIG. 13 shows a contour of the first of the two scattered light stops when seen in the beam path of imaging light passing through the projection optics according to FIG. 12.
Figure 14:
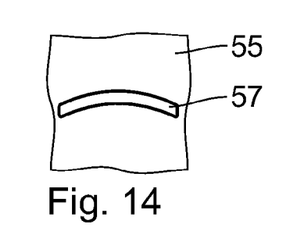
FIG. 14 shows a contour of the second of the two scattered light stops when seen in the beam path of imaging light passing through the projection optics according to FIG. 12.

In the embodiment of the projection optics 7 according to FIG. 12, two scattered light stops 54 and 55 are arranged in the two intermediate image planes 19 and 20. The two scattered light stops 54 and 55 define through-openings 56, 57 which are adapted to the bundles of imaging light 3. A contour of the through-opening 56 of the scattered light stop 54 is shown in FIG. 13. A contour of the through-opening 57 of the scattered light stop 55 is shown in FIG. 14. The scattered light stops 54, 55 are designed as mechanical stop plates.

Figure 15:
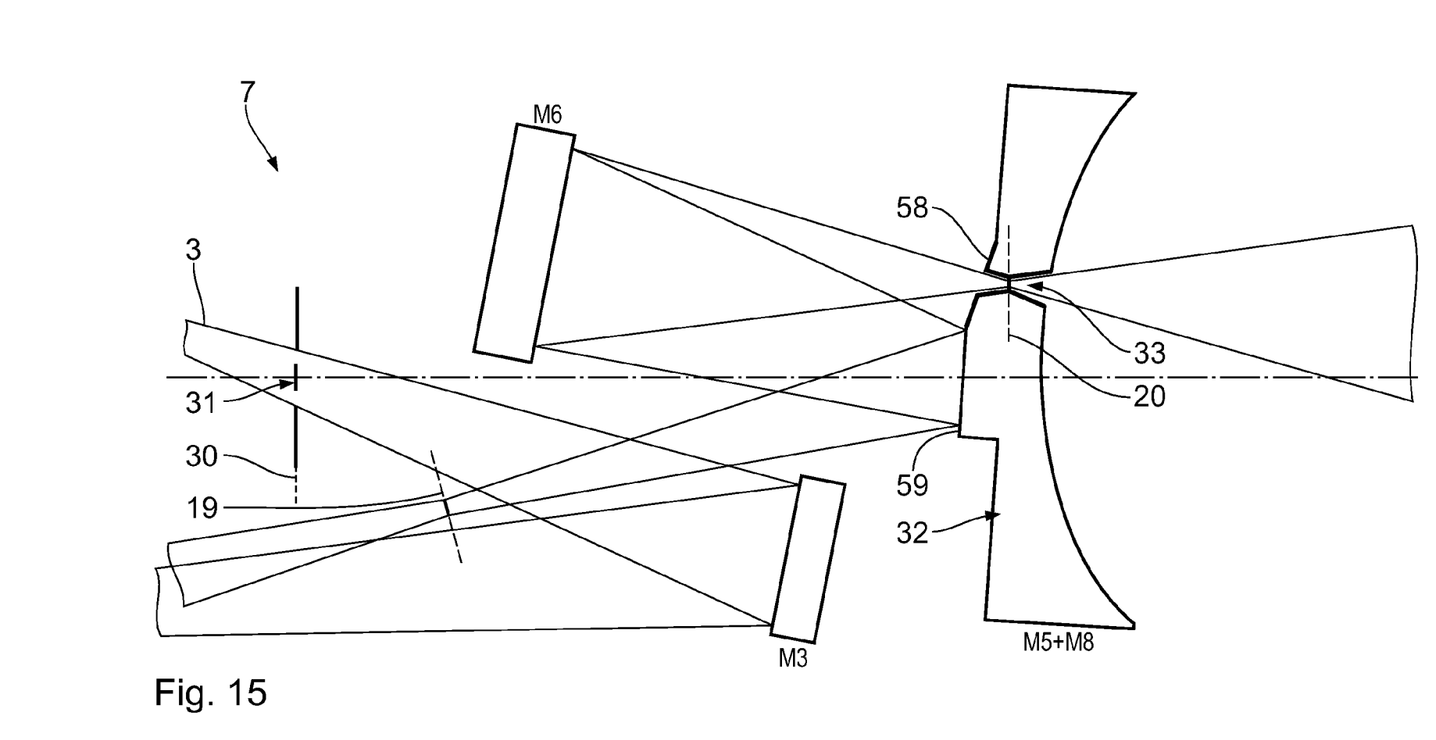
FIG. 15 shows a view similar to FIG. 2 of a portion of a projection optics including another embodiment of a monolithic mirror body including two mirrors of the projection optics, the mirror body being provided with a through-opening for imaging light to pass through which is designed for reducing scattered light.
Figure 16:
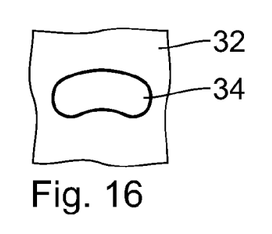
FIG. 16 shows a contour of the through-opening in the monolithic mirror body according to FIG. 15, seen from a side of the mirror body.
Figure 17:
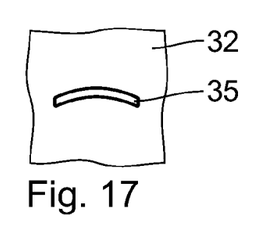
FIG. 17 shows a contour of the through-opening in the internal region of the monolithic mirror body.
Figure 18:
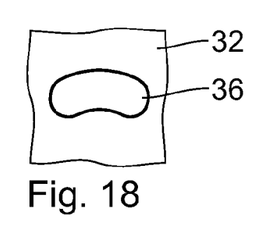
FIG. 18 shows a contour of the through-opening in the monolithic mirror body, seen from a side which is opposite to the side shown in FIG. 15.

FIG. 15 shows another embodiment of a projection optics 7 which may be used in the projection exposure apparatus 1. Components which correspond to those as already explained above with reference to FIGS. 1 to 14, and in particular to FIGS. 6 to 9, have the same reference numerals and are not discussed in detail again.

Comparable to the projection optics 7 according to FIG. 6, the projection optics 7 according to FIG. 15 has a monolithic mirror body 32 in which the two mirrors M5 and M8 are included. In the vicinity of the edge region 34, a surface portion 58 of the monolithic mirror body 32 according to FIG. 15 is chamfered with respect to a reflection surface 49 of the mirror portion M5 of the mirror body 32. Scattered light hitting the surface portion 58 at similar angles of incidence as the imaging light 3 is not reflected back to other mirrors of the projection optics 7, in particular the mirror M6, by the surface portion 58 and is thus prevented from undesirably reaching the substrate 12 or from being reflected back in the direction of the light source 2.

Corresponding to FIGS. 7 to 9, FIGS. 16 to 18 show the edge region 34, the internal region 35 and the edge region 36 of the through-opening 33 according to FIG. 15.

Figure 19:
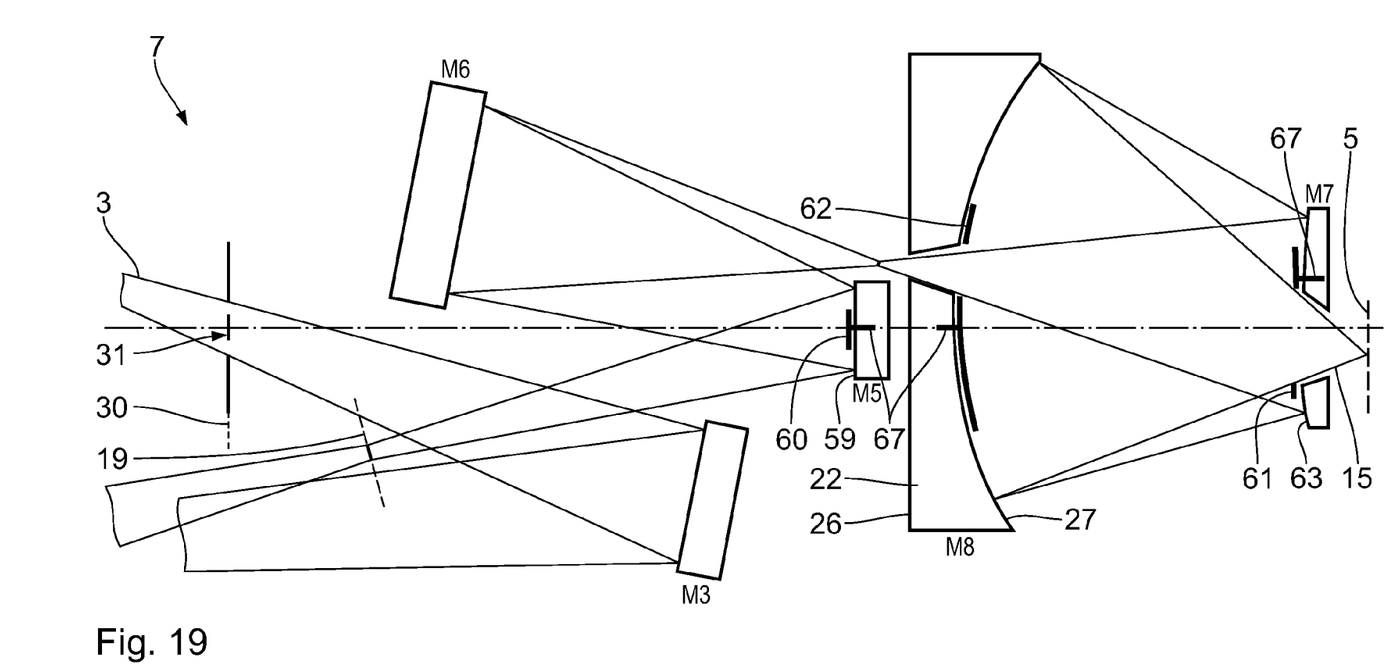
FIG. 19 shows a view similar to FIG. 2 of a portion of another embodiment of a projection optics to be used in a projection exposure apparatus according to FIG. 1 including three scattered-light obscuration stops in the region of the reflection surfaces of three mirrors of the projection optics which are close to the pupil.

FIG. 19 shows another embodiment of a projection optics 7 for the projection exposure apparatus 1. Components which correspond to those as already explained above with reference to FIGS. 1 to 18 have the same reference numerals and are not discussed in detail again. The illustration according to FIG. 19 additionally shows a mirror M7 in the beam path of the imaging light 3 between the mirrors M6 and M8.

In addition to the obscuration stop 31, the projection optics 7 according to FIG. 19 has an additional three scattered light obscuration stops 60, 61 and 62. The scattered light obscuration stop 60 is arranged in front of the reflection surface 59 of the mirror M5 and directly adjacent thereto. The scattered light obscuration stop 61 is arranged in front of a reflection surface 63 of the mirror M7 and directly adjacent thereto. The scattered light obscuration stop 62 is arranged in front of the reflection surface 27 of the mirror M8 and directly adjacent thereto.

Figure 20:
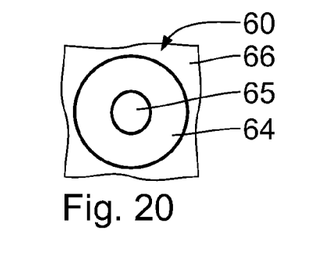
FIG. 20 shows a contour of a first one of the three scattered-light obscuration stops.

FIG. 20 shows a contour of the scattered light obscuration stop 60. The contour has a ring-shaped through-region 64 between a central stop portion 65 and an edge stop portion 66. The scattered light obscuration stop 60 is connected to the mirror M5 by a central support web 67. Corresponding support webs not shown in the drawing are used for supporting the edge stop portion 66 of the scattered light obscuration stop 60. The edge stop portion 66 may also be disposed of. An outer edge of the scattered light obscuration stop 60 is then defined by an edge of an optically used area of the mirror M5 and may be provided by the edge of a high-reflection coating on the mirror M5.

Figure 22:
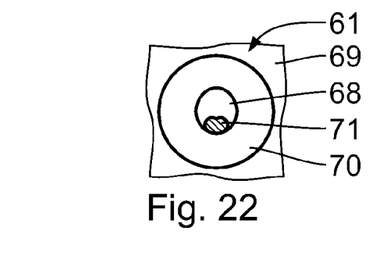
FIG. 22 shows a contour of a third one of the three scattered-light obscuration stops.

FIG. 22 shows a contour of the scattered light obscuration stop 61. The scattered light obscuration stop 61 also has a central stop portion 68 and an edge stop portion 69 between which is arranged a ring-shaped through-region 70. In the central stop portion 68 is arranged a through-opening 71 for the radiation bundle 15 to pass through. The bundle envelope funnel 16 may be arranged between the mirror M7 and the object plane 5. This is not shown in FIG. 19.

Figure 21:
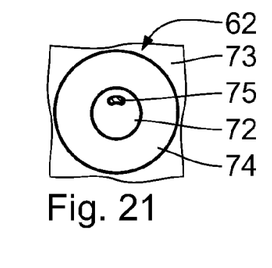
FIG. 21 shows a contour of a second one of the three scattered-light obscuration stops.

FIG. 21 shows the contour of the scattered light obscuration stop 62. The scattered light obscuration stop 62 also has a central stop portion 72 and an edge stop portion 73 between which is formed a ring-shaped through-region 74. In the central stop portion 72 is formed a through-opening 75 for imaging light 3 to pass through the beam path portion between the mirrors M6 and M7.

Compared to FIGS. 20 to 22, the illustration according to FIG. 19 is not to scale.

The scattered light obscuration stops 60 to 62 provide for a suppression of scattered light, in other words a suppression of light undesirably guided along with the bundle of imaging light 3.

The scattered light obscuration stops 61, 62 are in turn connected to the mirrors M7 and M8 via support webs 67.

Figure 23:
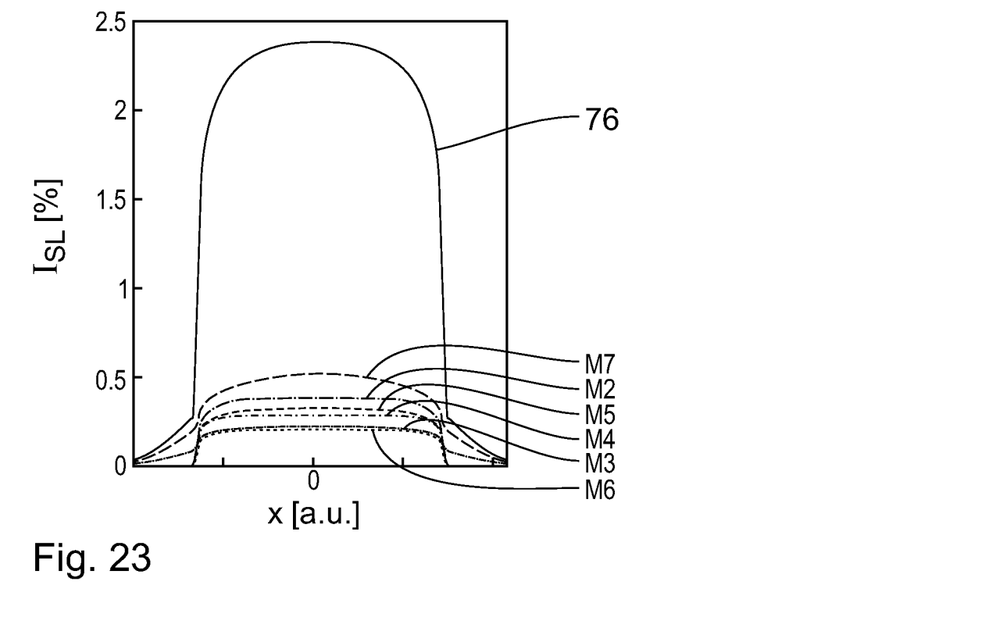
FIG. 23 shows a schematic view of a scattered light distribution attainable via scattered-light-reducing measures across the field height of the image field of the projection optics of the projection exposure apparatus according to FIG. 1 for portions of scattered light having a range greater than 1 µm, with not only a total scattered light portion but also the scattered light contributions of individual mirrors of the projection optics being shown.

FIG. 23 shows a percentage of a scattered light portion $I_{SL}$ integrated over the scanning direction, in other words over the y-direction, when seen across the x-dimension of the object field 4, in other words across the field height. FIG. 23 shows the scattered light portion for scattered light having a range greater than 1 μm, in other words a thermal scattered light portion. The range of the scattered light is the distance of a penetration point of a scattered light beam through the image plane 9 from a desired image point. The distance of scattered light with a range ≥1 μm from a desired image point is thus greater than 1 μm. A total scattered light portion is shown as curve 76 in FIG. 23. The total scattered light portion 76 has a maximum of 2.39% at central field height x=0.

FIG. 23 additionally shows the scattered light portions of the individual mirrors M1 to M8 of the projection optics 7 which add up to form the total scattered light portion 76. With a maximum of the scattered light portion of approximately 0.5% at field height x=0, the scattered light portion of the mirror M7, in other words in the object field center, is thus the dominating portion, followed by the scattered light portions of the mirrors M2, M5, M4, M3, M8, M1 and M6.

Figure 24:
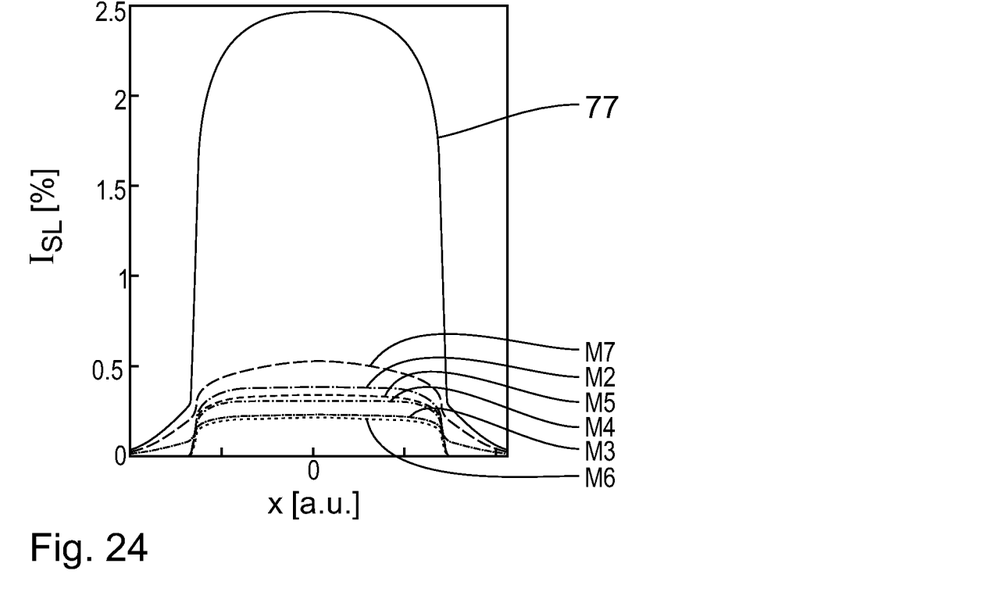
FIG. 24 shows a view similar to FIG. 23 of a scattered light distribution of scattered light portions having a range greater than 47 nm.

Similar to the illustration according to FIG. 23, FIG. 24 shows the scattered light portions having a range greater than 47 nm. At this wavelength, a total scattered light portion 77 has a maximum of 2.48% in the object field center at field height x=0. FIG. 24 also shows the scattered light portions of the individual mirrors M1 to M8. In terms of their relation to each other, the contributions of these scattered light portions correspond to the scattered light portions already explained with reference to FIG. 23.

What is claimed is:

1. An imaging optics, comprising:
   a plurality of mirrors comprising a mirror including a mirror body having an opening surrounded by a reflection surface; and
   an auxiliary device,
   wherein:
   the plurality of mirrors is configured to reflect light along a beam path to image an object field in an object plane into an image field in an image plane;
   the beam path of the light includes a pupil obscuration;
   the opening of the mirror body of the mirror having a through-opening portion and an assembly opening portion;
   the through-opening portion is configured so that, during use of the imaging optics, the through-opening portion allows the light to pass therethrough; and
   the auxiliary device is in the assembly opening portion.

2. The imaging optics of claim 1, wherein there is a space between an edge of the through-opening and an inner bundle edge of the light reflected by the reflection surface of the mirror during use of the imaging optics, and the space is less than 5 mm.

3. The imaging optics of claim 1, wherein a shape of a boundary wall of the through-opening is adapted to the beam path.

4. The imaging optics of claim 1, further comprising a light trap behind a side of the mirror which is opposite to the reflection surface of the mirror, wherein, during use of the imaging optics, the light trap deflects scattered light which passes through the through-opening.

5. The imaging optics of claim 4, wherein the light trap is an absorbing light trap.

6. The imaging optics of claim 4, further comprising a cooling device configured to cool the light trap.

7. An illumination system, comprising:
an imaging optics according to claim 1; and
an illumination optics configured to illuminate the object field with light.

8. A projection exposure apparatus, comprising:
a light source configured to generate the light; and
an illumination system, comprising:
an imaging optics according to claim 1; and
an illumination optics configured to illuminate the object field with light.

9. A method, comprising:
projecting a structure on a reticle onto a light-sensitive layer of a wafer using a projection exposure apparatus; and
creating a microstructure or a nanostructure on the wafer,
wherein the projection exposure apparatus comprises an illumination system, comprising:
an imaging optics according to claim 1; and
an illumination optics configured to illuminate the object field with light.

10. The imaging optics of claim 1, wherein the imaging optics has a pupil plane, and the opening of the mirror is in the region of the pupil plane of the imaging optics.

11. The imaging optics of claim 1, wherein the auxiliary device comprises a sensor.

12. The imaging optics of claim 1, wherein the auxiliary device comprises a deflection mirror.

13. The imaging optics of claim 1, wherein the auxiliary device comprises an actuator configured to deform the reflection surface of the mirror.

14. The imaging optics of claim 1, wherein the auxiliary device comprises a coupling mirror.

15. The imaging optics of claim 1, wherein the auxiliary device comprises a heating device.

16. The imaging optics of claim 1, wherein the auxiliary device comprises a cooling device.

17. The imaging optics of claim 1, wherein the auxiliary device comprises a deformation device.

18. The imaging optics of claim 1, wherein the auxiliary device comprises an actuator.

19. The imaging optics of claim 1, wherein the opening has a shape selected from the group consisting of elliptical and circular.

20. The imaging optics of claim 1, wherein the auxiliary device is configured so that it is not used to image light along a beam path to image an object field in an object plane into an image field in an image plane.

* * * * *